United States Patent [19]

Narahara et al.

[11] Patent Number: 4,989,224
[45] Date of Patent: Jan. 29, 1991

[54] COINCIDENCE CIRCUIT

[75] Inventors: Mitsumasa Narahara; Kazumi Yamauchi; Yuji Yatsuda; Shinichi Yasunaga, all of Kanagawa; Fujio Moriguchi; Nobuhisa Kato, both of Saitama, all of Japan

[73] Assignee: Fuji Xerox Co., Ltd., Tokyo, Japan

[21] Appl. No.: 277,172

[22] Filed: Nov. 29, 1988

[30] Foreign Application Priority Data

Dec. 1, 1987 [JP] Japan ................. 62-301568

[51] Int. Cl.$^5$ ............................ H03K 21/10
[52] U.S. Cl. ........................ 377/39; 377/56; 377/110
[58] Field of Search ............ 377/39, 110, 56

[56] References Cited

U.S. PATENT DOCUMENTS

| | | | |
|---|---|---|---|
| 3,622,987 | 11/1971 | Borkan | 377/39 |
| 3,878,370 | 4/1975 | Santomango et al. | 377/39 |
| 4,396,909 | 8/1983 | Suzuki | 377/110 |
| 4,612,658 | 9/1986 | Eby | 377/39 |

Primary Examiner—John S. Heyman
Attorney, Agent, or Firm—Finnegan, Henderson, Farabow, Garrett and Dunner

[57] ABSTRACT

A coincidence circuit for detecting when n-bit binary input data coincides with the current value of an n-bit counter. A plurality of "1" detecting circuits determine, when a corresponding input bit is one, whether a corresponding counter bit is also one. A first-coincidence detecting circuit determines the first time that all the "1" input bits have corresponding "1" clock bits. Each "1" detecting circuit includes an inverter and a NOR gate. The first-coincidence detecting circuit includes an OR gate and a latch circuit.

3 Claims, 8 Drawing Sheets

ENOR CIRCUIT

NOR CIRCUIT

NAND CIRCUIT

COINCIDENCE CIRCUIT

BACKGROUND OF THE INVENTION

1. Field of the Invention

The present invention relates to a coincidence circuit for judging the coincidence between binary data and, particularly, to a circuit for judging the coincidence between n-bits of binary data and an n-bit counter output.

2. Description of the Related Art

Such a coincidence circuit is applied, for example, to control a current conduction time for heating resistors in accordance with image data such as gradation data or the like, in a thermal recording apparatus. The coincidence circuit has a basic arrangement, for example, as shown in FIG. 7.

In FIG. 7, the reference numeral 10 represents an n-bit counter having n-stages of D-type flip-flops 11(1), 11(2), ..., 11(n), each having a $\overline{Q}$ output fed back to its own D input. The flip-flops 11(1), 11(2), ..., 11(n) are connected in series with one another by connecting the $\overline{Q}$ output of the flip-flop of one stage to the clock terminal (CK) of the flip-flop of the next stage. In the counter 10, the Q output of the flip-flop 11(1) corresponds to the least significant bit, the respective Q outputs of the subsequent flip-flops 11(2), ..., 11(n−1) correspond to subsequent bits, and the Q output of the flip-flop 11(n) corresponds to the most significant bit. The clock terminal (CK) of the flip-flop 11(1), which corresponds to the least significant bit, is the input terminal of the counter 10 to which a count signal is applied.

The reference numeral 20 represents a latch circuit for storing n-bit binary data. The latch circuit 20 has n stages of D-type flip-flops 21(1), 21(2), ..., 21(n). A latch signal is applied to clock terminals (CK) of the respective flip-flops 21(1), 21(2), ..., 21(n) so that, upon application of the latch signal, the most significant bit D1 is held by the flip-flop 21(1), the subsequent bits D2, ..., Dn-1 are held by the subsequent flip-flops 21(2), ..., 21(n−1), and the most significant bit Dn is held by the flip-flop 21(n). The latch signal applied to the latch circuit 20 is also applied through an inverter 12 to clear terminals (CL) of the respective flip-flops 11(1), 11(2), ..., 11(n) of the counter 10 so that the counter 10 is cleared simultaneously with the holding of the n-bit data in the latch circuit 20.

The Q outputs of the respective flip-flops 21(i) (i=1,2, ...,n), which are the respective output bits of the latch circuit 20, and the corresponding output bits of the counter 10, i.e., the Q outputs of the respective flip-flops 11(i) (i=1,2, ...,n), are applied to respective exclusive NOR (hereinafter referred to as "ENOR") gates 14(i) (i=1,2, ...,n). The outputs of the respective ENOR gates 14(1), 14(2), ..., 14(n) corresponding to the respective output bits of the counter 10 and the respective output bits of the latch circuit 20 are applied to an AND gate 16. The output of AND gate 16 is applied to the clock terminal of a D-type flip-flop 18. The $\overline{Q}$ output of the flip-flop 18 is fed back to its own D input so that its Q output is inverted whenever a clock is applied to its clock terminal (CK).

In the coincidence circuit, when the count value of the counter 10 becomes coincident with the latched data in the latch circuit 20, the respective outputs of all the ENOR gates 14(1), 14(2), ..., 14(n) are high and the output of the AND gate 16 becomes high so as to apply a clock to the flip-flop 18. The Q output of the flip-flop 18 is, thus, turned on as a coincidence judgment output.

In the above-mentioned coincidence circuit, in the case where the data to be held by the latch circuit 20 are gradation data representing one dot in a thermal recording operation, the current conduction control for the respective heating resistors corresponding to radation data can be realized if a current is made to flow into one of the heating resistors corresponding to the dot during a period beginning with a count start of the counter 10 until a coincidence judgment output.

However, such a coincidence circuit using ENOR gates for detecting the coincidence between n-bit binary data and corresponding bits of a counter, and further using a judgment circuit (the AND gate 16 and the flip-flop 18 in FIG. 7) for judging the detection of the coincidence in all the ENOR circuits, occupies a comparatively large area of a semiconductor integrated circuit (IC). This is because, in the above-mentioned coincidence circuit, the coincidence between the two bits applied to each ENOR gate is detected. Thus, a function must be provided for detecting both when the two bits have a value of "1" and when they have a value of "0", thereby making the circuit arrangement comparatively complicated.

Specifically, in the case of a MOS integrated circuit, MOS transistors are used as basic elements, and each basic element is formed into a NAND gate, a NOR gate or an inverter. More complex gates are realized as composites of these basic gates. The above-mentioned ENOR circuit consists of a NOR gate 22 and two NAND gates 23 and 24, as shown in FIG. 8. The NOR gate and the NAND gate each comprises four MOS transistors as shown in FIG. 9(a) and FIG. 9(b), respectively, and, therefore, twelve MOS transistors are necessary to constitute an ENOR gate. Generally, in the case of a functional circuit such as an ENOR gate that is formed as a composite gate constituted by a plurality of basic gates, the more complicated the function to be realized, the larger the scale of the circuit.

SUMMARY OF THE INVENTION

It is an object of the present invention to provide a coincidence circuit that uses functional circuits to form the coincidence circuit as a portion of a semiconductor integrated circuit and to arrange the coincidence circuit as simply as possible.

Additional objects and advantages of the invention will be set forth in part in the description which follows and, in part, will be obvious from the description or may be learned by the practice of the invention. The objects and advantages of the invention will be realized and attained by means of the elements and combinations particularly pointed out in the appended claims. To achieve the objects and in accordance with the purpose of the invention, as embodied and broadly described herein, the invention comprises single value detecting circuits each for detecting coincidence of a single predetermined value between a corresponding bit Di of n-bit binary data and a corresponding bit Ci of n-bit binary output data of a counter, and a first-coincidence detecting circuit for detecting whether or not each coincidence detecting circuit has detected a coincidence for the first time during an up-counting of the counter.

More specifically, a coincidence circuit of the present invention for judging coincidence between n-bit binary data and corresponding bits of the n-bit output of a counter during an up-counting of the counter comprises: a plurality of single value detecting circuits for detecting that corresponding bits of the n-bit binary data and the n-bit output of the counter have a predetermined value; and a first-coincidence detecting circuit for determining coincidence between the n-bit binary data and the n-bit output of the counter by detecting the first time that the single value detecting circuits, corresponding to all the bits where the n-bit binary data has a predetermined value, have detected that the corresponding bits of the n-bit binary data and the n-bit output of the counter have the predetermined value during a process of up-counting of the counter.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 1($b$) is a diagram further illustrating the embodiment of FIG. 1($a$);

DETAILED DESCRIPTION

Reference will now be made in detail to preferred embodiments of the present invention, examples of which are illustrated in the accompanying drawings. Whereever possible, the same reference numbers will be used throughout the drawings to refer to the same or like parts.

Figure 1A:
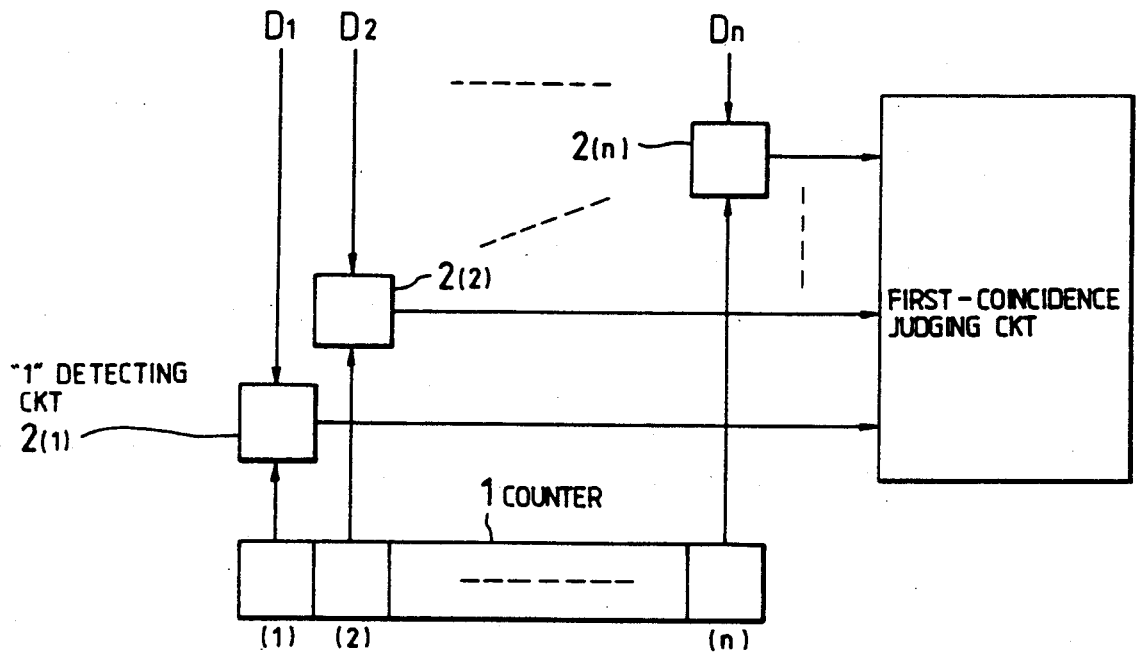
FIG. 1($a$) is a block diagram illustrating an embodiment of the present invention.
Figure 1B:
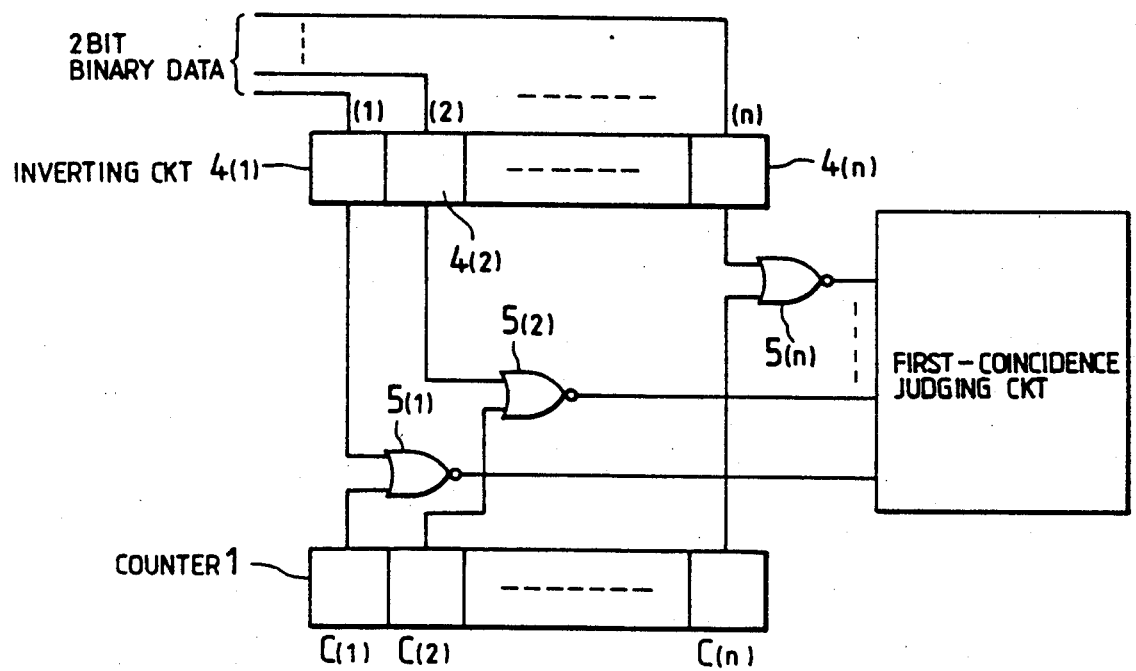

In the case where the coincidence circuit is formed as a part of a MOS semiconductor integrated circuit and, as shown in FIGS. 1($a$) and 1($b$), includes a plurality of single value detecting circuits, referred to hereinafter as "1" detecting circuits, that detect the coincidence of a "1" value in the respective n-bit data and n output bits of a counter. The "1" detecting circuits 2(1), 2(2), . . . , 2($n$) include inverting circuits 4(1), 4(2), . . . , 4($n$) for inverting the respectively corresponding bits of n-bit binary data. The "1" detecting circuits further include NOR circuits 5(1), 5(2), . . . , 5($n$) for receiving at respective first input terminals the outputs of respective inverting circuits 4(1), 4(2), . . . , 4($n$) and for receiving at respective second input terminals the values of respective corresponding bits C(1), C(2), . . . , C(N) of the output of the counter 1. Thus, the first-coincidence judging circuit 3 is arranged to judge the first coincidence of all of the NOR circuits 5(1), 5(2), . . . , 5($n$) corresponding to the respective bits, because the inverting circuits 4(1), 4(2), . . . , 4($n$) and the NOR circuits 5(1), 5(2), . . . , 5($n$) are formed of basic gates. Further, the above-mentioned coincidence circuit is generally arranged so that objective n-bit binary data are first latched and then the coincidence between the latched bits and the output of a timer is judged. When a latch is formed for the above purpose, the above-mentioned inverting circuit 4(1), 4(2), . . . , 4($n$) can easily be realized as a part of the latch circuit.

In the process of sequential upcounting of the counter 1, the value of each of the bits Cj of the counter 1 corresponding to the bits of the n-bit binary data will have a pattern of "0" and "1" values that repeats every $2^j$ count. The output value of the counter 1 at coincidence of respective bits Cj and Dj is the minimum of count values at which each of the respective bits Cj are Dj are "1." At this time, coincidence is realized in the process of up-counting at the minimum count value of the counter. The first-coincidence judging circuit 3 produces a judgment output when the n-bit binary data Dj are coincident with the output value Cj of the counter 1. Thus, the output of the first-coincidence judging circuit 3 is a coincidence judgment output of the above-mentioned coincidence circuit.

Figure 2:
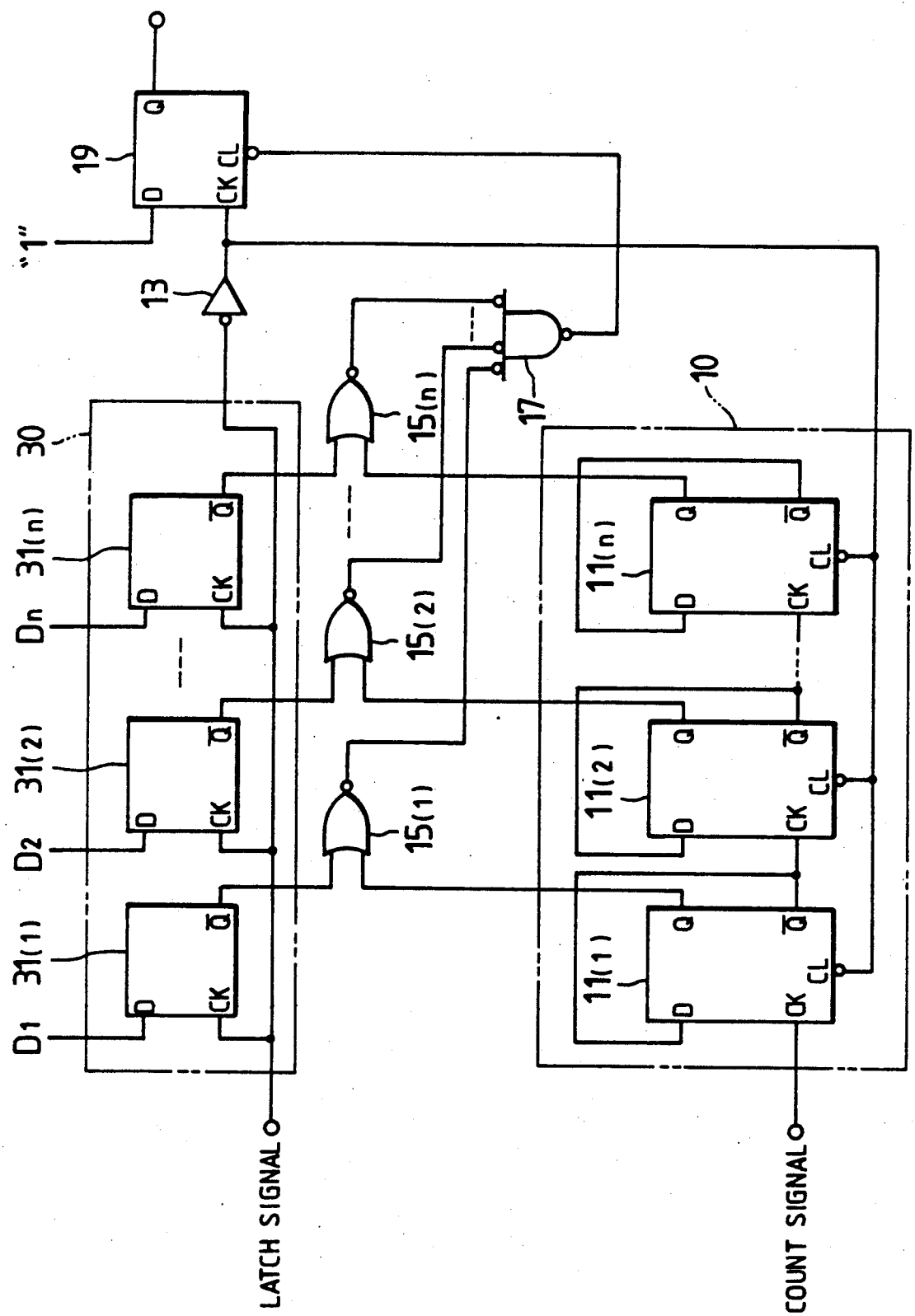
FIG. 2. is a circuit diagram illustrating an example of a coincidence circuit according to the present invention.

FIG. 2 is a circuit diagram illustrating an example of a coincidence circuit according to the present invention.

Figure 7:
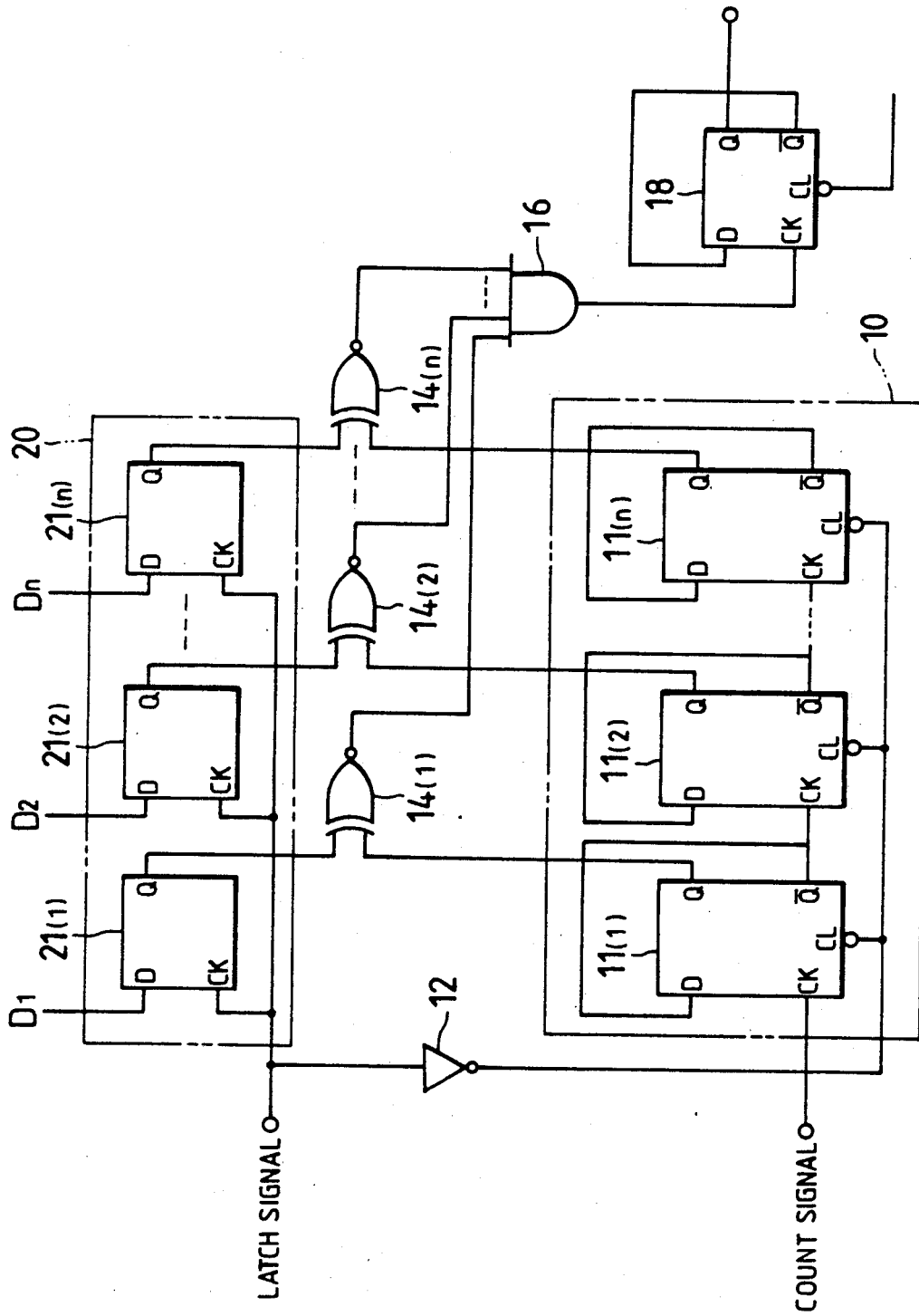
FIG. 7 is a circuit diagram illustrating an example of a coincidence circuit.
Figure 8:
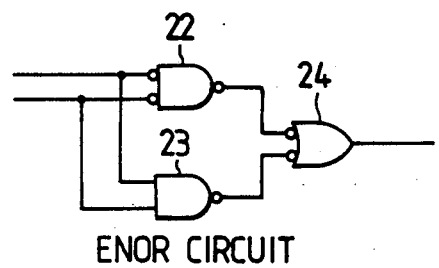
FIG. 8 is a diagram illustrating an arrangement of an ENOR circuit constituted by basic gates.

In FIG. 2, the reference numeral 10 represents an n-bit counter 10 similar to the counter shown in FIG. 7. Counter 10 is arranged so that D-type flip-flops 11(1), 11(2), . . . , 11($n$) are connected in series with each other and a count signal is applied to a clock terminal (CK) of the flip-flop 11(1) corresponding to the least significant bit. The reference numeral 30 represents an inversion latch circuit 30 for inverting n-bit binary data Dj and for storing the inverted data. The inversion latch circuit 30 includes n-stages of D-type flip-flops 31(1), 31(2), . . . , 31($n$). The $\overline{Q}$ output of each flip-flop 31(1) is an output from the inversion latch circuit 30. That is, the inversion latch circuit 30 is realized by using the inverted output of an ordinary latch circuit. As in the counter and the latch circuit of FIG. 7, the counter 10 and the inversion latch circuit 30 are arranged so that the flip-flops 11(1) and 31(1) correspond to the least significant bit, the subsequent flip-flops 11(1) and 31(2) through 11(n−1) and 31(n−1), respectively, correspond to the subsequent bits, and the flip-flops 11($n$) and 31($n$) correspond to the most significant bit. A latch signal is inputted to a clock terminal (CK) of each of the flip-flops 31($i$) of the inversion latch circuit 30 and, at the same time, inputted through an inverter 13 to a clear terminal (CL) of each of the flip-flops 11($i$) of the counter 10. Thus, the inversion latch circuit 30 is caused to perform inversion-holding of the n-bit data and the counter 10 is cleared.

The $\overline{Q}$ outputs of the respective flip-flops 31($i$) ($i$=1,2, . . . ,n), which are the respective output bits of the inversion latch circuit 30, and the corresponding output bits of the counter 10, i.e., the Q outputs of the respective flip-flops 11($i$) ($i$=1,2, . . . ,n), are respectively inputted to first and second input terminals of NOR gates 15($i$) ($i$=1,2, . . . ,n) corresponding to the respective bits of the counter 10. The respective output bits of the NOR gates 15($i$) ($i$=1,2, . . . ,n) are inputted to an OR circuit 17 and the output of the OR circuit 17 is inputted to a clear terminal (CL) of a D-type flip-flop 19 acting as a latch means. The flip-flop 19 is arranged so that "1" is normally inputted to its D input (for example, the input D is normally connected to a +5 V power source), so that the above-mentioned latch signal is inputted to its clock terminal (CK) through the inverter 13. Thus, the Q output of flip-flop 19 is kept at "1" after the leading edge of the latch signal is made low, while the Q output is made low by the trailing edge of the signal applied to the clear terminal (CL) of flip-flop 19.

The operation of the above-mentioned coincidence circuit will now be described.

For example, assume a case in which objective binary data are 5-bit data (10101). In the 5-bit data, the left end is the least significant bit D1, and the right end is the most significant bit D5.

The above-mentioned data are latched by the inverting latch circuit 30 at a leading edge of the latch signal, so that the output of the inversion latch circuit 30 becomes (01010) and the counter 10 is cleared so that its output becomes (00000). Then, a clock pulse is inputted to the clock input of the flip-flop 19 at the trailing edge of the latch signal, so that the output Q of the flip-flop 19 is kept at a high ("H") level. In this state, the outputs of the respective NOR gates 15(1), 15(2), 15(3), 15(4), and 15(5) become (10101) in this order, and the output of the OR circuit 17 becomes a "H" level.

Now turning to the "0" value bits of the objective binary data, i.e., the bits D2 and D4, the respective inputs to the NOR circuits 15(2) and 15(4) corresponding to these bits D2 and D4 from the inversion latch circuit 30 are "1," and the respective outputs of the NOR circuits 15(2) and 15(4) are always kept "0" (that is an "L" level) independently of the respective inputs to the NOR circuits 15(2) and 15(4) from the counter 10.

Upon receipt of a count signal at the input of the counter 10 after having been once reset to (00000) as described above, the counter 10 starts its up-count operation so as to change its output sequentially to (10000), (01000), (11000), (00100), .... Then, the outputs of the respective NOR circuits 15(1) to 15(5) are changed sequentially to (00101), (10101), (00101), (10001), .... At that time, the output of the OR circuit 17 is kept at an "H" level when any one of the outputs of the NOR circuits 15(1) to 15(5) is "1" (an "H" level). In such a process of the count-up of the counter 10, when the number of count signals reach "21" (10101), the outputs of the respective NOR gates 15(1) to 15(5) are (00000), so that the output of the OR circuit 17 is "0" (an "L" level) thereby clearing the flip-flop 19, so that the Q output of the flip-flop 19 is set to and "L" level as a coincidence judgment output. That is, when the output (10101) of the counter 10 becomes coincident with the objective 5-bit binary data (10101), a coincidence judgment output is produced.

Since the outputs of the respective NOR gates 15(2) and 15(4) corresponding to the second and fourth bits are always kept at "0," the output of the OR circuit 17 is made low in the same manner as the above-mentioned case whenever the output of the counter 10 takes (1X1X1) (X being either "0" or "1"). However, since (10101) is the minimum value of the outputs (1X1X1) of the counter 10, the OR circuit 17 is made low as described above for the first time when the output of the counter 10 becomes (10101). After the Q output of the flip-flop 19 is inverted by this first falling of the output of the OR circuit 17, the flip-flop 19 keeps its output in an "L" level state even if the output of the OR circuit 17 changes.

Figure 9A:
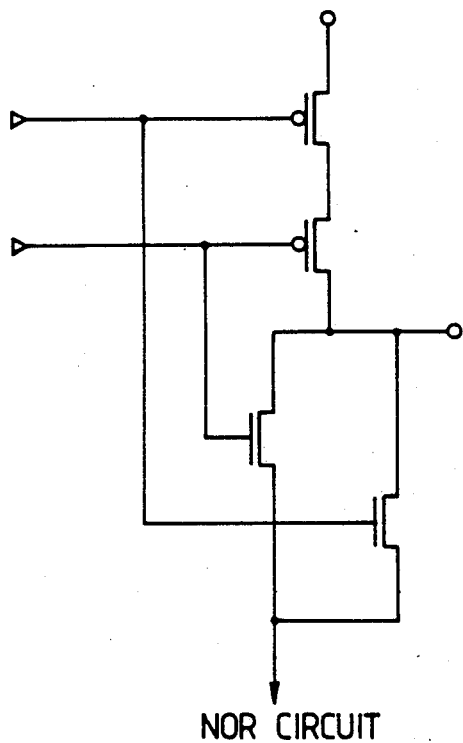
FIGS. 9($a$) and. 9($b$) are diagrams illustrating an arrangement of a NOR circuit and a NAND circuit by MOS transistors.
Figure 9B:
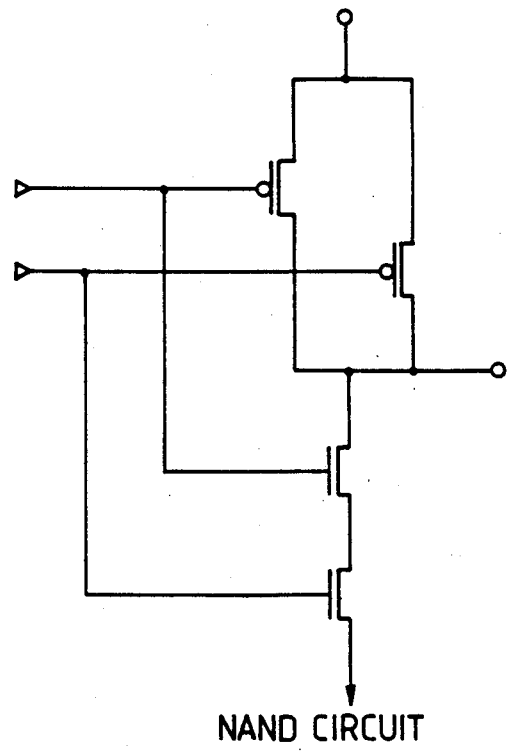

In the case where such a coincidence circuit as described above is realized, for example, as a part of a MOS semiconductor integrated circuit, each of the NOR circuits 15(1), 15(2), ..., 15(n) may be fabricated as a basic gate that can consist of four MOS transistors (as shown in FIG. 9(a)). Thus, the circuit arrangement of the coincidence circuit can be made comparatively simple, and the area occupied by the circuit can be made small.

In the above-mentioned embodiment, a "1" detecting circuit is realized by the inversion latch circuit 30, and the NOR gates 15(1), 15(2), ..., 15(n) are provided so as to correspond to respective bits of the inversion latch circuit 30. That is, in a condition that "1" ("0" before inversion) is applied to one input of a NOR circuit, the output of the NOR circuit is always "0" independently of the level of a second input thereof, i.e., the NOR circuit does not have a judging function with respect to the second input.

On the contrary, in a condition that "0" ("1" before inversion) is applied to the one input of the NOR circuit, the output of the NOR circuit is "0" when "1" is applied to the second input, while the output is "1" when "0" is applied to the second input, i.e., the NOR circuit does have a judging function with respect to the second input. This characteristic of a NOR circuit is applied to "1" detection. The present invention is not limited to NOR circuits, but may be realized by any circuit elements that realize functions similar to those described above. For example, the present invention may be realized by AND circuits or OR circuits. Even in the case where AND circuits or OR circuits are used, the circuit scale of the coincidence circuit becomes smaller than that of the conventional coincidence circuit realized by ENOR circuits.

An example in which the above-mentioned coincidence circuit is applied to a specific apparatus will now be described.

Figure 3:
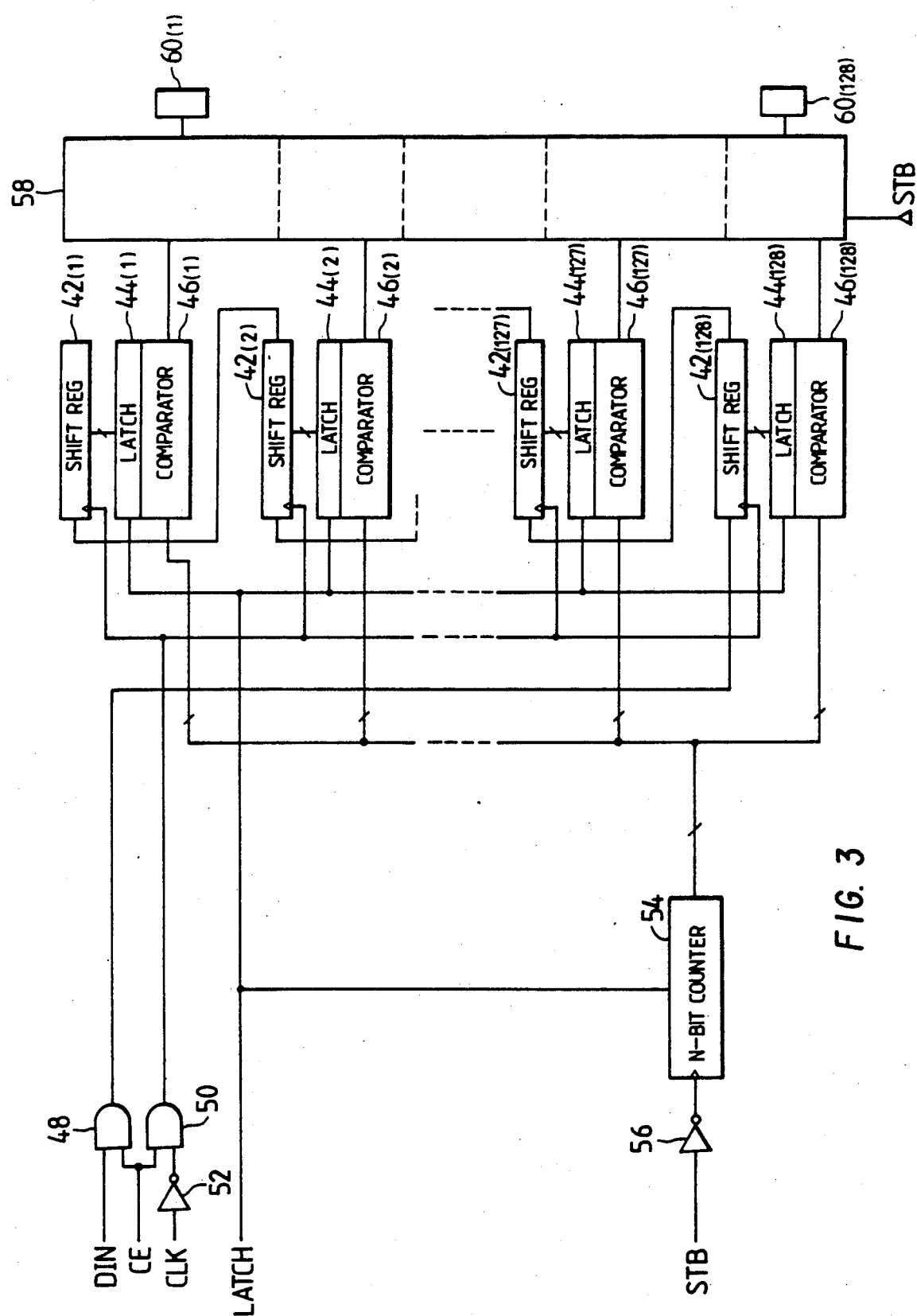
FIG. 3 is a diagram illustrating an example of a current conduction control in a circuit thermal recording apparatus that may utilize the coincidence circuit according the present invention.

FIG. 3 shows a current-conduction control circuit for heating resistors for printing dots in accordance with gradation data in a thermal printer. It is assumed in the example that parallel control of 128 heating resistors is performed. The number of gradations to be expressed is $n^2$ and the number of bits of the data corresponding to the gradation is n.

In FIG. 3, the reference numerals 42(1), 42(2), ..., 42(128) represent shift registers of n bits. The least significant bit of one shift register 42($i$) is connected to the most significant bit of another shift register 42(i+1) so that the respective shift registers are connected in series sequentially (i=1,2, ... ,127). The reference numerals 44(1), 44(2), ..., 44(128) represent latch circuits each having n bits for latching in parallel the n-bit data in the corresponding shift registers 42(1), 42(2), ..., 42(128), in synchronism with a leading edge of a latch signal (LATCH). The latch circuits 44(1), 44(2), ..., 44(128) correspond to the inversion latch circuit 30 in FIG. 2. The reference numerals 46(1), 46(2), ..., 46(128) represent comparator circuits, and 54 represents an n-bit binary counter 54 for performing count-up at the trailing edge of a strobe signal (STB) applied through an inverter 56.

Each of the comparator circuits 46($i$) is arranged to compare the n-bit data latched by the corresponding latch circuit 44($i$) with the output of the counter 54 to produce a coincidence judgment signal when the compared data are coincident with each other. The comparator circuits 46(i) correspond to the NOR circuits 15(1), 15(2), ..., 15(n), the OR circuit 17, the flip-flop 19, and so on, of FIG. 2, and the counter 54 corresponds to the counter 10 in FIG. 2. The counter 54 is reset to (000000) by the above-mentioned latch signal (LATCH).

A clock signal (CLK) is applied to the respective shift registers 42(i) in parallel through an AND gate 50, which is gate-controlled by an inverter 52 and an enable signal (CE), and, at the same time, gradation data are serially applied to the least significant bit of the 128th shift register 42(128) through an AND gate 48, which is gate-controlled by a similar enable signal (CE), so that the gradation data applied thereto in synchronism with a trailing edge of the clock signal are sequentially shifted up from the least significant bit of the 128th shift register 42(128) to the most significant bit of the first shift register 42(1).

A switching circuit 58 includes elements corresponding to the respective heating resistors. The switching circuit 58 is arranged to turn on high withstand-voltage MOS transistors 60(1), 60(2), ..., 60(128), which are current supply gates to the corresponding heating resistors, in response to the leading edge of the strobe signal (STB). The switching circuit 58 also turns off the high withstand-voltage MOS transistor 60(i) in response to a coincidence judgment signal from the comparator circuit 46(i) corresponding to the withstand-voltage MOS transistor 60(i).

The above-mentioned circuits related to the current conduction control for the heating transistors are part of one chip of a MOS IC.

Figure 4:
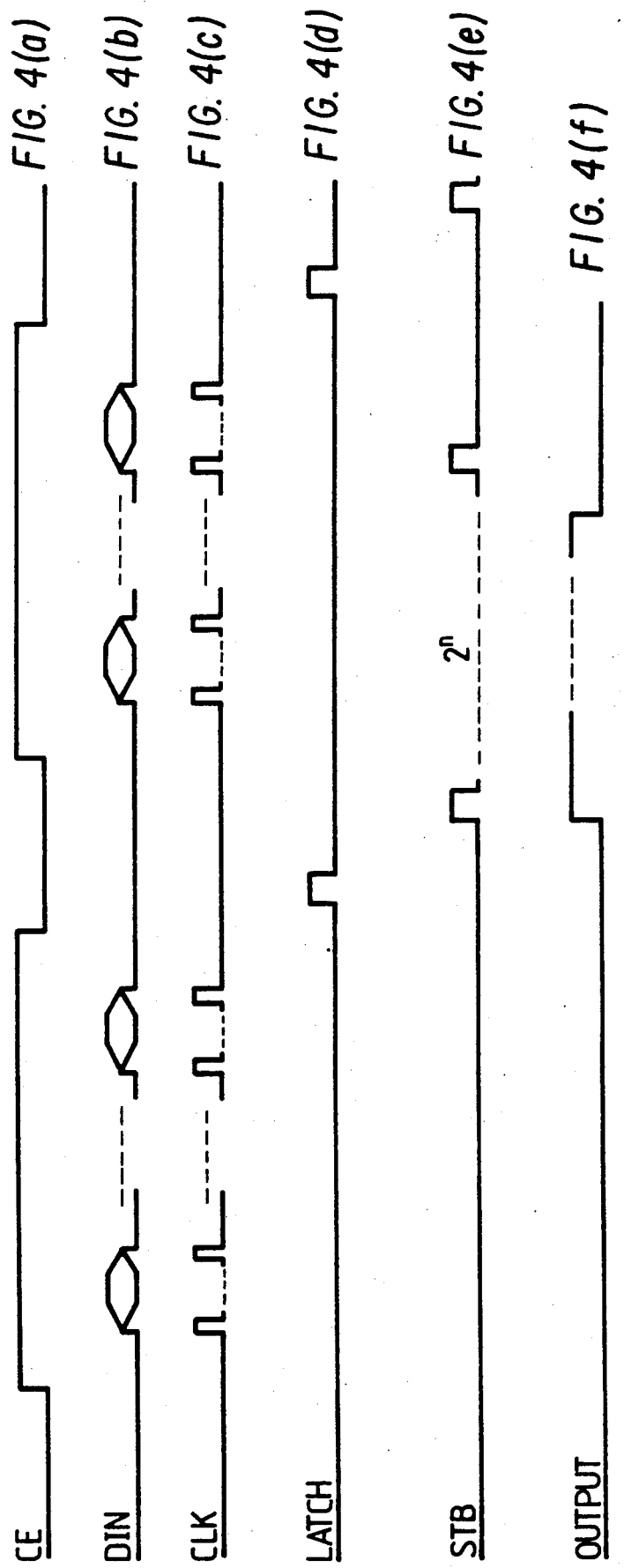
FIG. 4 is a timing chart illustrating states of signals of the circuit of FIG. 3.

The operation of the circuits is performed according to a timing chart shown in FIG. 4.

When the enable signal (CE) rises, the AND gates 48 and 50 are in an enabled state. In this state, if the clock signal (CLK) and gradation data of n bits (DIN) each are applied serially, sequentially, and continuously, the gradation data are shifted up from the 128th shift register 42(128) to the shift register 42(127), and so on, sequentially from the least significant bit to the most significant bit in each shift register, in synchronism with the respective trailing edges of the above-mentioned clock signal (CLK). The enable signal (CE) is made low at the time when the data transfer to the 128 shift registers 42(128), 42(127), ..., 42(1) has ended. At this time, the n bits of gradation data have been stored in each shift register 42(i). Next, when the latch signal (LATCH) is made high, the gradation data stored in the respective registers 42(i) are latched in parallel by the corresponding latch circuits 44(i) at the same time. After this transfer of the gradation data to the shift registers 42(i), the enable signal (CE) is made high to perform processing, such as data transfer or the like, in the same manner as the above-mentioned processing. Thereafter, similar processing is performed by making the enable signal (CE) high and low repeatedly. During the serial transfer of gradation data, the following processing is performed in parallel between the timing of making the latch signal (LATCH) high and the next timing of making the same low.

The switching circuit 58 is strobed in relation to the latch signal (LATCH) to turn on each high withstand-voltage MOS transistor 60(i) to make current conduction into the 128 heating resistors simultaneous. At this time, a strobe signal (STB) with a predetermined period T0 is supplied to the counter 54 so that the counter 54 counts up sequentially in synchronism with the strobe signal (STB). Then, each comparator circuit 46(i) compares the gradation data latched by the corresponding latch circuit 44(i) with the value of the count output of the counter 54, and outputs a coincidence judgment signal when the gradation data is coincident with the value of the count output. When the coincidence judgment signal is outputted from the comparator circuit 46(i), the corresponding element of the switching circuit 58 turns off the corresponding high withstand-voltage MOS transistor 60(i), thereby breaking the current conduction to the corresponding heating resistor. In the above-mentioned processing, the smaller the latched gradation data, the quicker the output of a coincidence judgment signal from a comparator circuit, and the shorter the current conduction time to the corresponding heating resistor. That is, the time of current conduction is controlled for every heating resistor to correspond to gradation data. The current conduction time T is expressed by the following equation when the gradation, expressed by n bits, is a.

$$T = T_0 \times a.$$

Thus, the current conduction to heating resistors is controlled on the basis of gradation data whenever the gradation data are latched, so that thermal recording with density corresponding to the gradation data is performed dot by dot.

Figure 5:
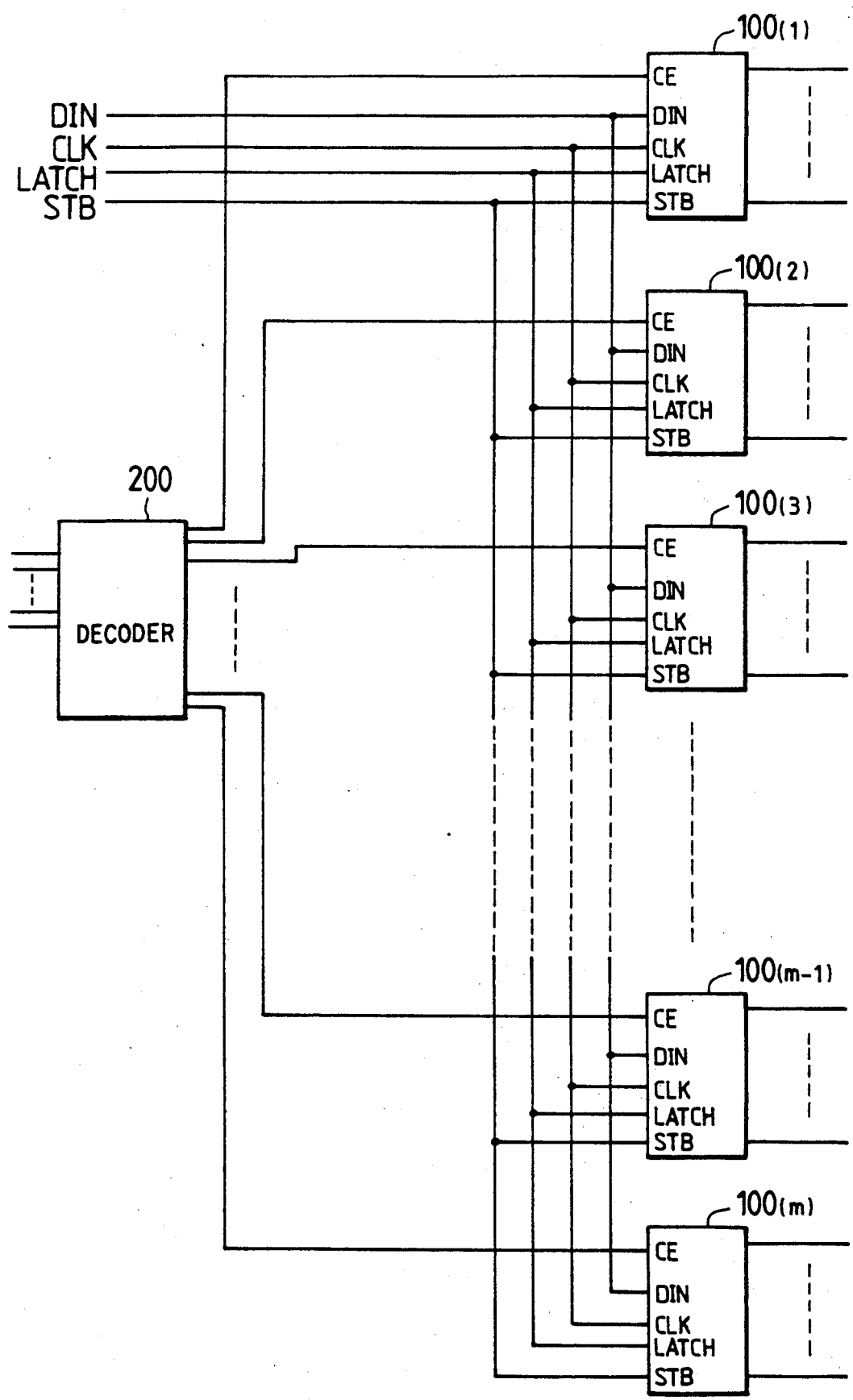
FIG. 5 is a diagram illustrating an example of a circuit arrangement of an expansion of the current conduction control circuit shown in FIG. 3.

The above-mentioned current conduction control circuit shown in FIG. 3 is contained on one MOS IC chip. In the case where a thermal recording apparatus having more dots in one line is considered, a plurality of one-chip ICs 100(1), 100(2), ..., 100(m) may be provided in accordance with the number of the heating resistors provided in a thermal head, for example, as shown in FIG. 5. The one-chip ICs 100(1), 100(2), ..., 100(m) are connected in parallel to a data line (DIN) and control signal lines (CLK, LATCH, STB). An enable signal (CE) is distributed by a decoder 200 into the respective devices, so that one-line dot-printing can be performed by sequential movement, for example, 128 dots by 128 dots.

Figure 6:
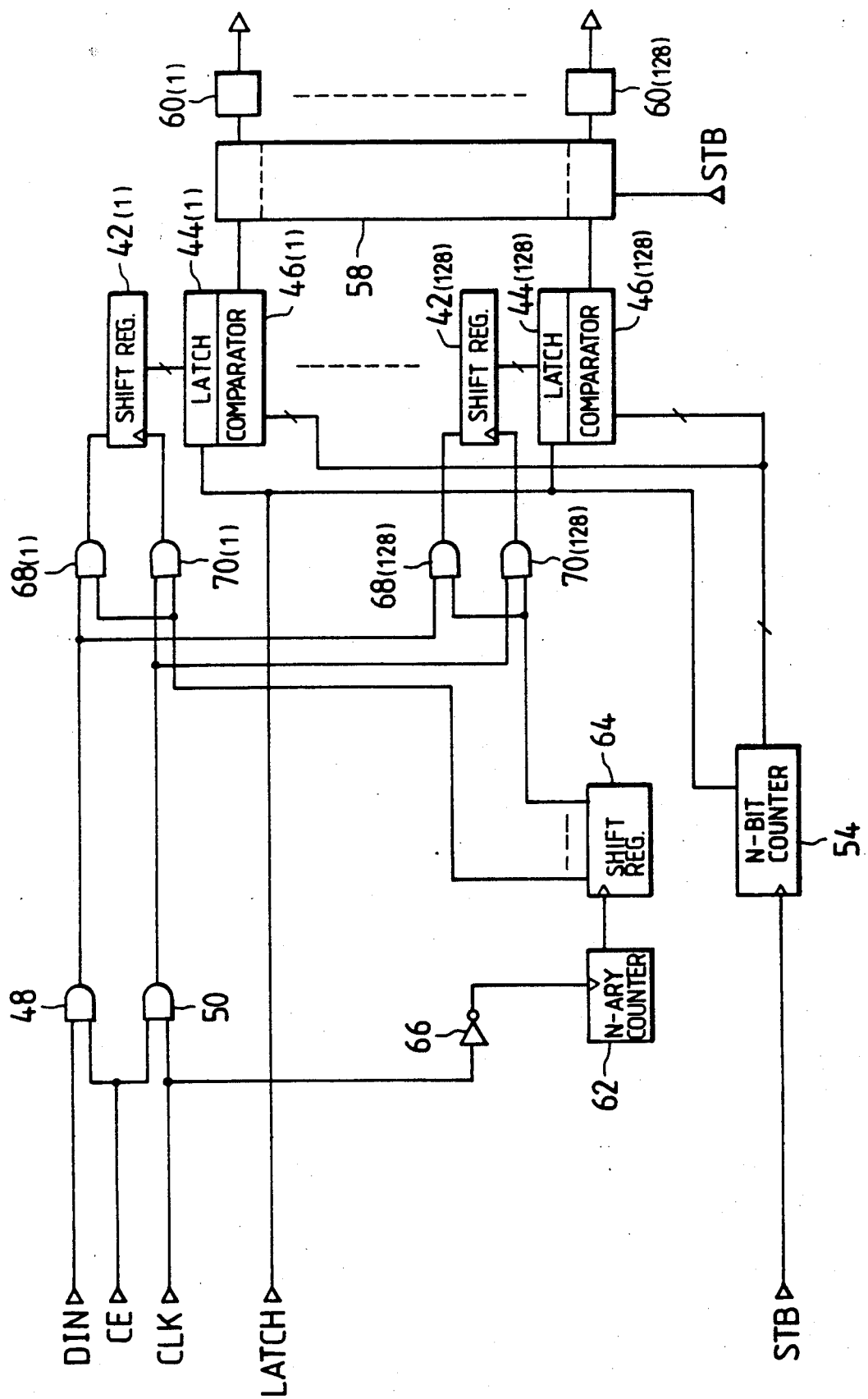
FIG. 6 is a circuit diagram illustrating another example of the current conduction control circuit of the present invention.

FIG. 6 shows another example of an arrangement of the above-mentioned current conduction control circuit.

In this example, the shift registers 42(i) (i=1,2, ... ,128) are not serially connected as shown in FIG. 4 and the storing of gradation data into the respective shift registers 42(i) (i=1,2, ... ,128) is performed through input data distribution.

That is, gradation data passed through an enabled AND gate 48 are further transferred through each of 128 AND gates 68(i) to the corresponding shift register 42(i). A shift pulse (CLK) passed through an AND gate 50 is supplied further through each of 128 AND gates 70(i) to the corresponding shift register 42(i). In storing the gradation data, the states of the respective AND gates 68(i) and 70(i) are switched sequentially. The state switching of the AND gate 68(i) and 70(i) is performed as follows:

An n-ary counter 62 counts a clock signal (CLK) applied thereto through an inverter 66 and produces a clock pulse every time n pulses of the clock signal have been counted. The produced clock pulse is supplied from the n-ary counter 62 to a shift register 64 having 128 stages. The output of each state of the shift register 64 is input to the corresponding AND gates 68(i) and 70(i). In the thus arranged circuit, the output stage of the shift register 64 is shifted sequentially every n pulses of the clock signal (CLK), and the enabled state of the AND gates 60(i) and 70(i) is sequentially switched from the AND gates 68(1) and 70(1) to the AND gates 68(128) and 70(128) inclusive. Consequently, the gradation data transferred sequentially in series in synchronism with the clock signal (CLK) are distributed to the respective shift registers 42(i) every n bits. Then, upon completion of the transfer of the gradation data to the respective shift registers 42(i), the enable signal (CE) is made low and, thereafter, in the same manner as the example shown in FIG. 3, in accordance with the gradation data stored in each shift register 42(i), the current conduction to the respective heating resistors is started, and the gradation data are compared with the count value of the counter 54 so that the current conduction to the respective heating resistors is terminated at the time when the gradation data become coincident with the count value of the counter 54.

As has been described above, the coincidence circuit according to the present invention is applicable to current conduction control corresponding to gradation data on heating resistors of a thermal head in a thermal recording apparatus. Moreover, in addition to such a thermal recording apparatus, the coincidence circuit according to the present invention is also applicable to a driving circuit for a high voltage device. For example, if the specification of the high withstand-voltage MOS transistors used in the output stage of the coincidence circuit is changed, the present invention could be used in a self-luminous VFD (fluorescent character display tube), a PDP (plasma display), an ELD (electroluminescence display) or the like, in a plane display apparatus. Furthermore, the coincidence circuit is applicable to general time control in accordance with given data.

As has been described above, according to the present invention, single value detecting circuits, and preferably "1" detecting circuits capable of detecting coincidence only with respect to a predetermined value, such as "1" in the case of "1" detecting circuits, between the bits of n-bit binary data and respectively corresponding bits of the output of a counter are used in place of coincidence detection circuits using, for example, ENOR circuits, capable of detecting coincidence with respect to multiple values, e.g., both the values "1" and "0". Accordingly, the coincidence circuit according to the present invention can be constructed of functional circuits for realizing a simpler function. Since the coincidence circuit is arranged so simply, the area occupied by the circuit on a semiconductor integrated circuit is comparatively small, thereby reducing the limitation in circuit arrangement and making it possible to enlarge the degrees of freedom in designing the semiconductor elements.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A current control circuit for controlling the supply of current to a plurality of resistors for use in a thermal print head in a printing of an image corresponding to n-bit image data comprising:
   a counter for producing n-bit count data;
   a coincidence circuit for judging a coincidence between bits of the n-bit image data and corresponding bits of the n-bit count data, the coincidence circuit including, a plurality of single value detecting circuits for detecting that corresponding bits of the n-bit image data and the n-bit count data have a predetermined value, and
   a first coincidence judging circuit for determining a coincidence between the n-bit image data and the n-bit count data by detecting a first time that said single value detecting circuits corresponding to all bits of said n-bit image data having said predetermined value have detected that said corresponding bits of said n-bit image data and said n-bit count data have said predetermined value during an up-counting of said counter; and
   a switching circuit for controlling the supply of current to said resistors in accordance with a count signal of said counter at a time when said first coincidence judging circuit determines that all of said single bit detecting circuits have detected that said corresponding bits of said n-bit image data and said n-bit count data have said predetermined value.

2. The current control circuit according to claim 1, wherein said plurality of single value detecting circuits comprise:
   a plurality of shift registers for receiving said n-bit image data, said shift registers having n stages, each of said stages storing a different one of the bits of the n-bit image data; and
   a plurality of latches connected to corresponding ones of said shift registers for receiving the bits of the n-bit image data stored in said stages.

3. The current control circuit according to claim 2, wherein said first coincidence judging circuit comprises a plurality of comparators, each of said comparators being associated with and connected to a different one of said plurality of latches to receive said bits of said image data stored in said stages of said associated latch, each of said comparators being further connected to said counter for comparing said bits of said n-bit image data to said corresponding bits of the n-bit count data.

* * * * *